United States Patent [19]

Liou et al.

[11] Patent Number: 5,371,041
[45] Date of Patent: Dec. 6, 1994

[54] METHOD FOR FORMING A CONTACT/VIA

[75] Inventors: Fu-Tai Liou, Carrollton; Robert O. Miller, The Colony; Mohammed M. Farohani, Carrollton; Yu-Pin Han, Dallas, all of Tex.

[73] Assignee: SGS-Thomson Microelectronics, Inc., Carrollton, Tex.

[21] Appl. No.: 831,089

[22] Filed: Feb. 7, 1992

Related U.S. Application Data

[60] Continuation of Ser. No. 545,927, Jun. 29, 1990, abandoned, which is a division of Ser. No. 366,194, Jun. 8, 1989, Pat. No. 4,962,414, which is a continuation of Ser. No. 154,868, Feb. 11, 1988, abandoned.

[51] Int. Cl.$^5$ .............................................. H01L 21/44
[52] U.S. Cl. ............................ 437/192; 437/190; 437/194; 148/DIG. 147
[58] Field of Search ............... 437/190, 192, 200, 193, 437/195

[56] References Cited

U.S. PATENT DOCUMENTS

| | | | |
|---|---|---|---|
| 3,953,266 | 4/1976 | Takai | 437/189 |
| 4,398,335 | 8/1983 | Lehrer | 437/192 |
| 4,489,481 | 12/1984 | Jones | 29/591 |
| 4,566,026 | 1/1986 | Lee et al. | 357/71 |
| 4,640,004 | 2/1987 | Thomas et al. | 437/190 |
| 4,680,612 | 7/1987 | Hieber et al. | 357/71 |
| 4,751,198 | 6/1988 | Anderson | 148/DIG. 147 |
| 4,772,571 | 9/1988 | Scovell et al. | 437/192 |
| 4,784,973 | 11/1988 | Stevens et al. | 148/DIG. 147 |
| 4,829,024 | 5/1989 | Klein et al. | 437/193 |
| 4,851,295 | 7/1989 | Brors | 437/200 |
| 4,851,369 | 7/1989 | Ellwanger et al. | 437/200 |
| 4,884,123 | 11/1989 | Dixit et al. | 437/192 |
| 4,910,578 | 3/1990 | Okamoto | |
| 4,920,071 | 4/1990 | Thomas | 437/200 |
| 4,963,511 | 10/1990 | Smith | 437/192 |
| 5,227,335 | 7/1993 | Holschwandner et al. | 437/190 |

FOREIGN PATENT DOCUMENTS

| | | | |
|---|---|---|---|
| 0060030 | 5/1981 | Japan | 437/190 |
| 58-46631 | 3/1983 | Japan | 437/200 |
| 0227119 | 12/1984 | Japan | 437/200 |
| 0043822 | 3/1985 | Japan | 437/200 |
| 0117719 | 6/1985 | Japan | 437/193 |
| 61-142739 | 6/1986 | Japan | 437/192 |
| 61-183942 | 8/1986 | Japan | 437/192 |
| 0308315 | 12/1988 | Japan | 437/190 |
| 0036051 | 2/1989 | Japan | 437/192 |

OTHER PUBLICATIONS

High Aspect Ratio Hole Filling by WCVD . . . ; Suguro et al. J. Appl. Phys. 62(4); 15 Aug. 1987; pp. 1265–1273.

*Primary Examiner*—Tom Thomas
*Assistant Examiner*—Michael Trinh
*Attorney, Agent, or Firm*—Gregory M. Howison; Kenneth C. Hill; Lisa K. Jorgenson

[57] ABSTRACT

A method for forming a connection between two levels in a semiconductor structure includes first forming a VIA (14) through an insulating layer (12) to an underlying structure (10). Sidewall spacers (22) and (24) are formed on the vertical walls of the VIA (14). The spacers (22) and (24) have tapered surfaces. A barrier layer (30) is then formed over the bottom surface of the VIA followed by CVD deposition of a conductive layer (32) of $WSi_2$ to provide a conformal conductive layer. An aluminum layer (38) is then deposited by physical vapor deposition techniques with the descending portions of layer (32) providing a conductive connection between the aluminum layer (38) and the lower structure (10) in the VIA (14).

10 Claims, 1 Drawing Sheet

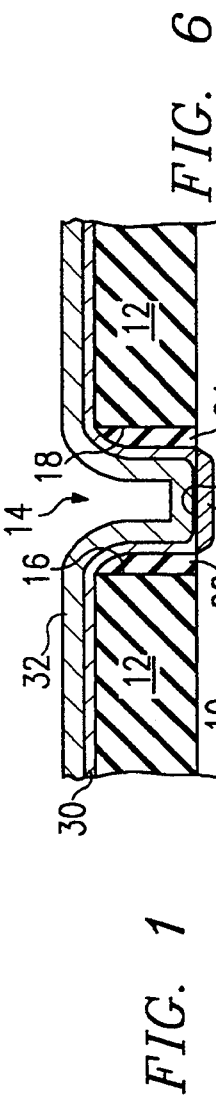
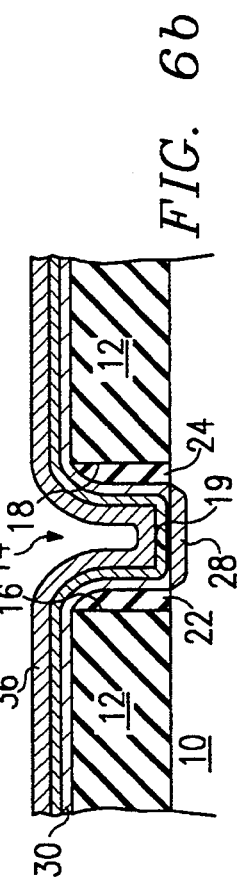
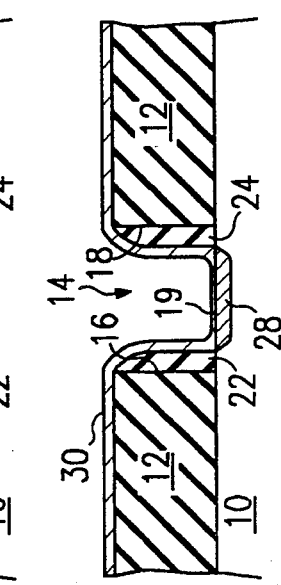
FIG. 6
FIG. 6a
FIG. 6b
FIG. 7
FIG. 1
FIG. 2
FIG. 3
FIG. 4
FIG. 5

METHOD FOR FORMING A CONTACT/VIA

This application is a continuation of application Ser. No. 07/545,927, filed 06/29/90 now abandoned which application is a division of application Ser. No. 07/366,194, filed Jun. 8, 1989, now issued as U.S. Pat. No. 4,962,414, which is a continuation of application Ser. No. 154,868, filed Feb. 11, 1988, abandoned.

TECHNICAL FIELD OF THE INVENTION

The present invention pertains in general to contacts and VIAs utilized in a semiconductor process, and, more particularly, to improving the step coverage of the contacts and VIAs.

BACKGROUND OF THE INVENTION

In semiconductor processing, one of the more critical process steps is the interconnection of two conducting layers on different levels that are separated by an insulating layer, especially when one of the conductive layers is the top metal layer. Presently, an underlying conductor layer is covered with an interlevel oxide layer and then the contact or VIA formed therein to expose the surface of the underlying conductor layer at a selected area. A top conducting layer is then patterned and interconnected through the contact or VIA with the underlying conducting material. This underlying conducting material can comprise either a conductive layer of polysilicon or metal or even the silicon surface itself.

To realize a conductive interconnection between the two layers, it is important that the contact interface between the underlying metal or silicon presents a low resistance without altering the characteristics of the underlying material, especially when the material is silicon. Further, it is important that the resistance between the contact interface itself and the upper metal layer also presents a low resistance.

One disadvantage with past processing techniques is "voiding" of the upper metal layer on the vertical surfaces of the contact opening or VIA. This can result from a number of factors. One factor which is prominent in the industry is that when sputtering or physical vapor deposition techniques are utilized to deposit a metal layer, the coverage is not conformal. Since this is an anisotropic process, vertical surfaces in a contact opening or VIA have only a relatively thin layer of metal formed on the vertical walls with a thick "build up" along the upper edges of the contact opening or VIA. The voiding typically occurs along these vertical surfaces. This can be solved by utilizing chemical vapor deposition of a conductive material. However, chemical vapor deposition processes are normally not suited to the types of metal, etc., that are required for upper levels, such as for aluminum metalization processes.

SUMMARY OF THE INVENTION

The present invention disclosed and claimed herein comprises a method for forming a contact between two conductive layers on different levels. A silicon substrate or first conductive layer forms a lower level of conductive material. This layer is covered by a layer of interlevel oxide. An opening is formed through the layer of interlevel oxide and then a conformal layer of refractory material is deposited over the structure to cover the side walls of the opening to a uniform thickness. This provides conduction between both levels separated by the interlevel oxide layer. A metal layer is then sputtered on the upper surface to provide an interconnection between the upper portion of the layer of refractory material and other structures on the upper level.

In another embodiment of the present invention, the refractory material is deposited over the entire substrate extending over the surface of the interlevel oxide and the bottom surface of the opening adjacent the lower level. A barrier metal is disposed between the conformal layer of refractory material and the lower conductive level.

In yet another embodiment of the present invention, a sidewall oxide layer is formed on the sidewalls of the opening with a tapered profile. The tapered profile extends from a narrow portion at the upper level to a wider portion at the lower level, such that the opening at the upper level is larger. This provides a more graduated step over which the conformal layer of refractory material is formed. The refractory material in the preferred embodiment is tungsten disilicide.

BRIEF DESCRIPTION OF DRAWINGS

For a more complete understanding of the present invention and the advantages thereof, reference is now made to the following description taken in conjunction with the accompanying Drawings in which:

FIG. 1 illustrates a cross sectional diagram of a silicon substrate or metal layer with an oxide layer formed thereon and having a contact/VIA formed therethrough;

FIG. 2 illustrates the structure of FIG. 1 with a thin layer of oxide formed thereover;

FIG. 3 illustrates a cross-sectional diagram of the structure of FIG. 2 with the upper layer of the oxide etched away to form a sidewall oxide in the contact/VIA;

FIG. 4 illustrates the structure of FIG. 3 with a thin layer of refractory metal formed thereon;

FIG. 5 illustrates a cross-sectional diagram of the structure of FIG. 4 with the refractory metal converted to a barrier layer of refractory material;

FIG. 6 illustrates a cross-sectional diagram of the structure of FIG. 5 with a layer of CVD refractory material formed over the barrier layer;

FIGS. 6a and 6b illustrate an alternate method for forming the CVD layer of refractory material of FIG. 6 wherein a layer of refractory metals is first formed over the structure of FIG. 5 followed by a layer of polycrystalline silicon to form a silicide layer; and FIG. 7 illustrates a cross-sectional view of the structure of FIG. 6 with a layer of metal formed over the substrate, which layer was sputtered on by physical vapor deposition techniques.

DETAILED DESCRIPTION OF THE INVENTION

Referring now to FIG. 1, there is illustrated a cross-sectional diagram of a semiconductor structure 10 with an interlevel oxide 12 formed thereover. The semiconductor structure 10, in the preferred embodiment, is silicon. However, for the purposes of describing the invention, the structure 10 could represent a first-level of conductor, as will be described in more detail herein below.

The oxide layer 12 is normally referred to as an interlevel oxide which is an oxide having a thickness of approximately 5,000–10,000 Å. After formation of the oxide layer 12, a contact or VIA 14 is formed in the oxide layer 12 which will hereinafter be referred to as VIA 14. As viewed in cross- section, the VIA 14 has two vertical sidewalls 16 and 18, and is formed by patterning the surface of the oxide layer 12 with a photoresist operation and then subjecting the structure to an anisotropic plasma etch, which etches away oxide in the unmasked areas, thus forming the vertical sidewalls 16 and 18.

After formation of the VIA 14, a conformal layer of insulating material 20 is then deposited over the VIA 14 and the oxide layer 12 to conformally coat the vertical sidewalls 16 and 18 and the bottom surface of the contact/VIA 19. The insulating layer 20 may advantageously comprise deposited silicon oxide or nitride. This may be deposited by a conventional or low-temperature reaction process using chemical vapor deposition techniques. The layer 20 may be formed several thousand angstroms in thickness; preferably, is formed at a thickness of 2,000 Å. As described above, the layer 20 conforms to the geometry of the VIA 14 and adheres to the vertical walls or sidewalls 16 and 18.

As illustrated in FIG. 3, the insulating layer 20 is anisotropically removed resulting in a structure wherein the sidewalls 16 and 18 are covered by relatively thick sidewall oxide layers 22 and 24, respectively. By way of illustration, if the thickness of the insulated layer 20 were 2,000 Å, the lateral thickness of the sidewall oxides 22 and 24 would be approximately 2,000 Å proximate to the bottom surface 19 and slightly thinner proximate the upper surface of the oxide layer 20. Therefore, the sidewall oxide layers 22 and 24 will have a tapered surface rather than a vertical surface. As will be described hereinbelow, this will present a "rounded" surface to the formation of conductive layers in the VIA 14.

The insulating layer 20 may be anisotropically removed by various techniques; preferably an etch is used which preferentially etches the insulating layer 20 in only the vertical direction without significant undercutting or lateral etch. The formation of sidewall oxides is utilized widely in the industry for a number of purposes. One purpose is to seal the sidewalls on various conductive structures such as the gates of MOS transistors or to provide a spacer from a vertical wall for implantation techniques. A process for forming sidewall oxides is described in detail in U.S. Pat. No. 4,356,040, issued to Horng-Sen Fu, et. al., on Oct. 26, 1982, which U.S. Patent is incorporated herein by reference.

After formation of the sidewall oxide layers 22 and 24, a thin layer of refractory metal 26 is sputtered onto the substrate to thickness of approximately 500 Å. In the preferred embodiment, the refractory metal utilized is titanium. The titanium is then subjected to a Rapid Thermal Anneal (RTA) in an atmosphere of nitrogen or $NH_3$ which results in the formation of a layer of titanium silicide ($TiSi_2$) 28 formed at or beneath the surface of the silicon substrate 10 proximate to the bottom 19 of the VIA 14 and a layer of titanium nitride ($T_iN$) 30 over the remaining portions of the VIA 14, outer surfaces of the sidewall layers 22 and 24 and the upper surfaces of the oxide layer 12. It will be appreciated that some portion of the titanium layer 26 consumes silicon to form the silicide layer 28 and the nitrogen reacts with the titanium to form the titanium nitride. When the titanium in the titanium layer 26 is reacted in the nitrogen atmosphere to form titanium disilicide, the process results in two competing reactions occurring over silicon. The first reaction is the formation of titanium nitride which grows downward from the gas phase as in conjunction with a second reaction to form titanium silicide which grows upward from the silicon interface. Since these competing reactions have unequal activation energies, the $TiN/TiSi_2$ thickness ratio is a sensitive function of temperature. However, the result is that there is a formation of some predetermined amount of TiN overlying the silicon in the titanium nitride layer 30 which is thinner than the remaining portions of the titanium nitride layer 30 overlying the oxide. Both the titanium silicide layer 28 and titanium nitride layer 30 are very conductive materials with the portion of the titanium nitride layer 30 and the titanium silicide layer 28 proximate to the bottom 19 of the VIA 14 forming a barrier metal. The formation of the layers 28 and 30 is illustrated in FIG. 5. It should be noted that if a lower level conductor is present at the bottom 19 of the VIA 14 and the lower level conductor does not comprise or contain silicon, the titanium silicide layer 28 will not form. The purpose of the titanium nitride layer 30 is to provide a barrier to any interaction between later formed layers and underlying material such as the silicon. However, if the underlying layer is a metal such as Aluminum, TiN should be directly sputtered on the surface of the Aluminum, instead of the step of RTA of Ti. For example, if a metal were deposited directly on the silicon, some "spiking" or "tunneling" may occur, which phenomena are well known in the industry.

After formation of the barrier titanium nitride layer 30 on the bottom surface 19 of the VIA 14, a conformal conductive layer 32 is formed over the titanium nitride layer 30 to a thickness of approximately 2,000 Å. Typically, to form a conformal layer, a chemical vapor deposition technique (CVD) is utilized. In the present embodiment, tungsten disilicide ($WSi_2$) is deposited by CVD deposition. Of the various silicides, $WSi_2$ is the only one at present that can conveniently be deposited by CVD deposition to provide a conformal layer. By contrast, sputtering materials such as aluminum to provide the conductive layer requires the use of a physical vapor deposition process. Typically, this is an anisotropic process which results in poor coverage on vertical or near vertical surfaces. Therefore, it is an important aspect of the present invention that a process is utilized that will result in a highly conductive layer formed on the sidewall in VIA 14. As will be described in more detail hereinbelow, the important portion of the conformal layer 32 with respect to its conductivity is the portion thereof that is adjacent to the outer surfaces of the sidewall oxide layers 22 and 24 and separated therefrom by the titanium nitride layer 30. This provides the conductive step. It is important to note that the conformal nature of the layer 32 and the step coverage provided thereby is enhanced by the use of the sidewall oxide layers 22 and 24 which operate as a "tapered spacer".

Although the preferred embodiment utilizes direct deposition of $WSi_2$ by CVD techniques, it should be understood that various techniques can be utilized to deposit a highly conductive layer. For example, polycrystalline silicon could be utilized, which is suitable for CVD processes, but its sheet resistance is relatively high, thus degrading the conductive nature of the conductor. Another technique that can be utilized is illustrated with respect to FIGS. 6a and 6b. In FIG. 6a, a layer 34 of titanium is sputtered onto the substrate to a thickness of approximately 800 Å in a vacuum at a temperature of approximately 100° C. This is then followed by a layer 36 of doped or undoped polycrystalline silicon that is deposited by CVD techniques to a thickness of approximately 1,500 Å. The substrate is then subjected to an RTA at approximately 950° C. for approximately thirty seconds to form a titanium silicide. The titanium silicide region is approximately 2,000–3,000 Å thick. Although titanium silicide is utilized in the present embodiment, it should be understood that any silicide such as $MoSi_2$, $WSi_2$ or $TaSi_2$ could be utilized. After reaction to form the titanium silicide, the conductive layer 32 would therefore be formed of titanium silicide rather than tungsten silicide. It should be understood that the disadvantages caused by the non-conformality of physical vapor deposited films apply mainly to thick films. This situation is mitigated to some degree by the physical vapor deposition of a thin film (e.g., Ti) and then building on it with a CVD film (e.g., poly).

Referring now to FIG. 7, after formation of the conductive layer 32, a layer 38 of metal is sputtered over the layer 32. In the preferred embodiment, the metal layer 38 is aluminum which is sputtered on to a thickness of approximately 5,000–8,000 Å. The aluminum layer 38 can be seen to have a relatively constant thickness in the portions that overlie the oxide layer 12. However, the portion overlying the VIA 14 is variable in thickness. This thickness is due to the anisotropic nature of the sputtering process. Although illustrated as a continuous coverage in VIA 14, there is still a possibility that voids can appear. The probability of voids is somewhat diminished due to the presence of the layers 22 and 24 which provide a tapered surface and the conformal layer 32 which also provides somewhat of a tapered surface rather than a sharp edge or step. However, it is not important whether there is a sharp edge or step presented to the aluminum layer 38, since the conductive connection to the bottom 19 of the VIA 14 is provided by the conformal layer 30 of titanium nitride and conformal layer 32 of $WSi_2$. As described above, for purposes of interconnection of the metal layer 38 with the surface of the silicon, or in the case of an underlying conductive layer, the underlying conductor, the only portion of the conformal layers 30 and 32 that provides the necessary conductive interconnection are the portions extending from the upper level to the lower level. It is therefore only necessary that these portions exist for providing a reliable interconnection between the metal layer 38 and the bottom surface 19 of the VIA 14.

Although the horizontal surfaces of the conformal layers 30 and 32 of titanium nitride and $WSi_2$ do not function primarily to provide a conductive interconnection between the metal layer 38 and the bottom surface 19 of the VIA 14, they do otherwise, or in any case provide for a better electromigration resistant metal system.

In summary, there has been provided a process for improving step coverage and reliability of a VIA/contact opening. The process utilizes a sidewall oxide spacer formed on the vertical walls of the VIA/contact opening followed by formation of a barrier metal layer on the bottom surface of the VIA/contact opening. A conformal layer of refractory material such as a silicide, is then deposited over the structure to conformally cover the surfaces of the VIA/contact opening including the outer surfaces of the sidewall spacers. The sidewall spacers provide a tapered surface that extends at an angle with respect to the bottom surface of the VIA/contact opening. A metal layer is then sputtered onto the conformal layer with the conformal layer providing a conductive interconnection between the upper level and the lower level such that any step coverage problems with respect to the sputtering process are overcome.

Although the present invention has been described in detail, it should be understood that various changes, substitutions and alterations can be made therein without departing from the spirit and scope of the invention as defined by the appended claims.

What is claimed is:

1. A method for forming a contact for a semiconductor integrated circuit device, comprising the steps of:
   forming an insulating layer over a conductive silicon region;
   forming an opening in the insulating layer to expose a portion of the conductive silicon region, such opening having substantially vertical sidewalls;
   forming a refractory metal silicide region on the exposed portion of the conductive silicon region;
   forming a refractory metal nitride layer over the insulating layer, extending into the opening, and covering the refractory metal silicide region;
   forming a conformal refractory metal silicide layer over the refractory metal nitride layer and extending vertically into the opening to contact portions of the refractory metal nitride layer directly overlying the refractory metal silicide region; and
   forming an aluminum layer over the conformal conducting layer.

2. The method of claim 1, wherein the steps of forming a refractory metal silicide region and forming a refractory metal nitride layer are performed simultaneously, by the steps comprising:
   forming a layer of refractory metal over the insulating layer, the sidewalls of the opening, and the exposed conductive silicon region; and
   heating the device in a nitrogen ambient atmosphere, wherein a portion of the refractory metal layer is converted to refractory metal silicide on the exposed conductive silicon region, and the remainder of the refractory metal layer is converted to refractory metal nitride.

3. The method of claim 2, wherein the refractory metal layer comprises titanium.

4. The method of claim 1, further comprising the step of:
   after said step of forming an aluminum layer, patterning the aluminum layer, the refractory metal silicide layer, and the refractory metal nitride layer to define interconnect.

5. The method of claim 1, wherein the step of forming a refractory metal silicide layer comprises the step of:
   depositing tungsten silicide over the refractory metal nitride layer using chemical vapor deposition.

6. The method of claim 1, wherein said step of forming a refractory metal silicide layer comprises the steps of:
   depositing a refractory metal layer over the refractory metal nitride layer;
   depositing a polycrystalline silicon layer over the refractory metal layer; and
   heating the device to convert the polycrystalline silicon and refractory metal layers into a refractory metal silicide layer.

7. The method of claim 6, wherein the refractory metal layer comprises titanium.

8. The method of claim 7, wherein the refractory metal nitride layer comprises titanium nitride.

9. The method of claim 8, wherein the refractory metal silicide layer comprises tungsten silicide.

10. The method of claim 1, further including the step of:
before the step of forming a refractory metal silicide region, forming insulating sidewall spacers on the vertical sidewalls of the opening.

* * * * *

UNITED STATES PATENT AND TRADEMARK OFFICE
CERTIFICATE OF CORRECTION

PATENT NO. : 5,371,041
DATED : December 6, 1994
INVENTOR(S) : Fu-Tai Liou, Robert O. Miller, Mohammed M. Farahani, Yu-Pin Han It is certified that error appears in the above-identified patent and that said Letters Patent is hereby corrected as shown below:

On the title page: Item [75]

inventors, change "Mohammed M. Farohani"

to -- Mohammed M. Farahani --.

Signed and Sealed this

Eighteenth Day of July, 1995

*Attest:*

BRUCE LEHMAN

*Attesting Officer*       *Commissioner of Patents and Trademarks*